(12) United States Patent
Nistler

(10) Patent No.: US 10,830,846 B2
(45) Date of Patent: Nov. 10, 2020

(54) TRANSMITTING ANTENNA FOR A MAGNETIC RESONANCE DEVICE

(71) Applicant: Siemens Healthcare GmbH, Erlangen (DE)

(72) Inventor: Jürgen Nistler, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/277,154

(22) Filed: Feb. 15, 2019

(65) Prior Publication Data

US 2019/0257896 A1 Aug. 22, 2019

(30) Foreign Application Priority Data

Feb. 16, 2018 (EP) ..................... 18157062

(51) Int. Cl.
*G01R 33/34* (2006.01)
*G01R 33/36* (2006.01)
(Continued)

(52) U.S. Cl.
CPC .... *G01R 33/34046* (2013.01); *G01R 33/34076* (2013.01); *G01R 33/3678* (2013.01); *G01R 33/422* (2013.01); *H01Q 21/24* (2013.01)

(58) Field of Classification Search
CPC ........ G01R 33/34046; G01R 33/34076; G01R 33/3678; G01R 33/422
See application file for complete search history.

(56) References Cited

U.S. PATENT DOCUMENTS 6,118,274 A * 9/2000 Roffmann ........ G01R 33/34053
324/318
9,541,614 B2 * 1/2017 Soutome ................ G01R 33/34
(Continued)

FOREIGN PATENT DOCUMENTS

DE 102008006117 A1 7/2009

OTHER PUBLICATIONS

De Zanche, Nicola, et al. "Algebraic method to synthesize specified modal currents in ladder resonators: Application to noncircular birdcage coils." Magnetic resonance in medicine 74.5 (2015): 1470-1481.
(Continued)

*Primary Examiner* — Steven L Yeninas
(74) *Attorney, Agent, or Firm* — Lempia Summerfield Katz LLC

(57) ABSTRACT

A transmitting antenna for a magnetic resonance device includes a plurality of antenna conductors arranged spaced from one another circumferentially around a center line and extending parallel to the center line, and a screening element extending parallel to the center line and circumferentially encompassing the antenna conductors. For at least one pair of the antenna conductors, a radial distance between a first antenna conductor of the pair and the screening element is smaller than a radial distance between a second antenna conductor of the pair and the screening element, a width of the first antenna conductor is smaller in the circumferential direction than a width of the second antenna conductor in the circumferential direction, axial ends of the first antenna conductor are coupled together via a higher capacitance capacitor than axial ends of the second antenna conductor.

12 Claims, 3 Drawing Sheets

(51) Int. Cl.
*H01Q 21/24* (2006.01)
*G01R 33/422* (2006.01)

(56) References Cited

U.S. PATENT DOCUMENTS

| | | | |
|---|---|---|---|
| 2009/0192382 A1 | 7/2009 | Nistler | |
| 2009/0267606 A1* | 10/2009 | Lazar | G01R 33/34076 324/318 |
| 2012/0025833 A1* | 2/2012 | Iwama | G01R 33/34 324/322 |
| 2012/0176137 A1* | 7/2012 | Terada | G01R 33/385 324/322 |
| 2012/0182013 A1* | 7/2012 | Biber | G01R 33/34076 324/318 |
| 2012/0262173 A1 | 10/2012 | Soutome | |
| 2012/0268132 A1* | 10/2012 | Zhu | G01R 33/3692 324/322 |
| 2013/0015858 A1* | 1/2013 | Ferrand | G01R 33/34076 324/322 |
| 2013/0119991 A1* | 5/2013 | Soutome | A61B 5/055 324/322 |
| 2013/0221966 A1* | 8/2013 | Zhu | G01R 33/3642 324/318 |
| 2015/0054506 A1* | 2/2015 | Eberler | G01R 33/34076 324/309 |
| 2016/0216344 A1* | 7/2016 | Habara | G01R 33/34007 |
| 2016/0259020 A1* | 9/2016 | Okamoto | G01R 33/34076 |

OTHER PUBLICATIONS

European Search Report for European Patent Application No. 18157062.3-1022 dated Jul. 25, 2018.

\* cited by examiner

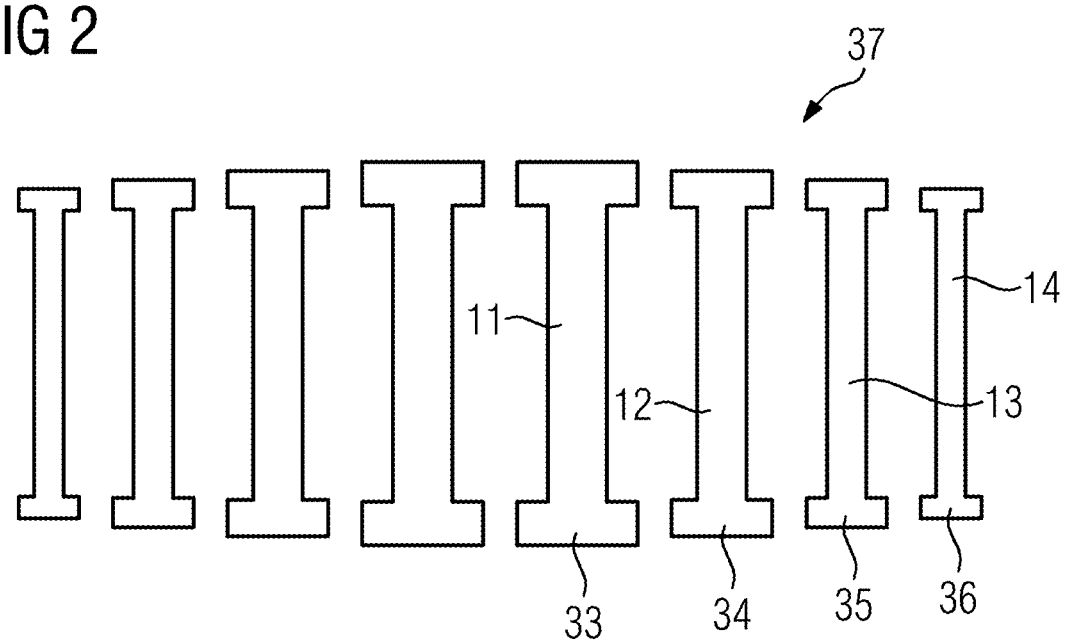
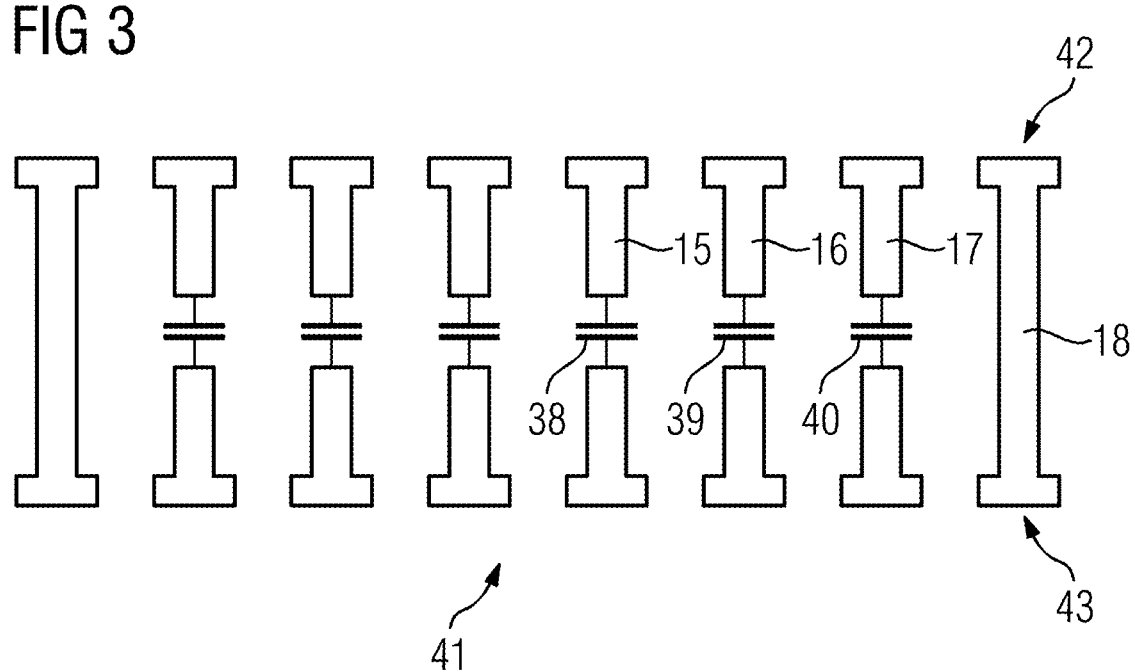

TRANSMITTING ANTENNA FOR A MAGNETIC RESONANCE DEVICE

This application claims the benefit of EP 18157062.3, filed on Feb. 16, 2018, which is hereby incorporated by reference in its entirety.

BACKGROUND

The present embodiments relate to a transmitting antenna for a magnetic resonance device.

Magnetic resonance tomography has become a commonly used method of three-dimensional imaging in, for example, medical imaging. In this method, nuclear spins are excited in an object (e.g., in a patient) by high frequency electromagnetic waves, and electromagnetic waves emitted as this excitation decays are received and evaluated for imaging purposes. One possible way of irradiating corresponding high frequency waves is to use cylindrical antennas, which accommodate an object under investigation or parts of an object under investigation inside the object under investigation. In this case, a plurality of parallel antenna conductors, which are arranged, for example, around the circumferential surface of a cylinder, are used. To prevent disturbance of further devices outside the measurement region, these antenna conductors are surrounded by a screening element (e.g., a cylindrical shield). Such transmitting antennas are conventionally supplied with identical excitation signals with a phase shift of 90° via spaced terminals, so as to provide a circularly polarized B1 field for exciting nuclear spins. By modifying the excitation or the antenna geometry, it is also possible, according to document DE 10 2008 006 117 A1, for elliptical polarization of the emitted wave to be achieved.

To improve the availability of magnetic resonance tomographs, it is advantageous for the magnetic resonance tomographs to be made as inexpensively and compactly as possible. One approach to achieving this is to reduce the height of the interior of a whole-body antenna used in a magnetic resonance tomograph. In order nonetheless to allow sufficient width for accommodating objects under investigation (e.g., patients), it may, in this respect, be necessary to deviate from the conventional cylindrical surface shape when arranging the antenna conductors or in the case of the shape of a screening element used. The problem in this respect has hitherto been that the homogeneity of the B1 field and thus typically also the achievable measurement quality decreases the greater the deviation from a cylindrical surface shape. In addition, such deviations also lead to uneven distribution of current to the various antenna conductors, resulting in higher component loading and in increased specific absorption rates for portions of the object under investigation that are close to the highly energized antenna conductors.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a cost- or space-optimized construction of a transmitting antenna is provided.

In the case of a transmitting antenna of the above-stated type, the width of the first antenna conductor is smaller in the circumferential direction than the width of the second antenna conductor in the circumferential direction, and/or axial ends of the first antenna conductor are coupled together via a higher capacitance capacitor than axial ends of the second antenna conductor.

For the purposes of the present embodiments, the above-explained disadvantages in the event of deviation of the arrangement of the antenna conductors or of the shape of the screening element from an ideal cylindrical shape are very largely caused by the fact that different radial spacing of the antenna conductors from the screening element results in the inductance of the individual antenna conductors and thus the impedance for the high-frequency signals used varying between the antenna conductors. When the antenna conductors are of identical configuration, the inductance of an individual antenna conductor and thus a corresponding impedance increases as the radial distance from the screening element increases. The result thereof is relatively large currents for antenna conductors having a radial distance from the screening element that is relatively small and vice versa.

According to the present embodiments, identical antenna conductor configuration is deviated from by varying the width of the antenna conductors or the magnitude of a capacitor integrated into the antenna conductors. Because the width of the antenna conductors in the circumferential direction is reduced for the antenna conductors that extend close to the screening element, and/or because a capacitor connected into these antenna conductors is selected to be of higher capacitance than for antenna conductors that are further away, the above described variation in impedance and thus in current flow between the antenna conductors may be compensated at least in part. In this way, if a circularly polarized B1 field is to be emitted, the homogeneity thereof may be improved. In addition, due to the uniform current distribution to the antenna conductors, the maximum component loading of the transmitting antenna and the local maxima of the specific absorption rate may be reduced or prevented.

Advantageous widths may be estimated by considering theoretical formulae for the inductance of a straight wire in the vicinity of a conductive wall. If the screening element is, for example, approximated as an ideally conductive wall and the antenna conductors are approximated as straight wires, then the inductance is proportional to the logarithm of the coefficient of twice the distance of the respective antenna conductor from the screening element and the wire diameter. In a first approximation, the width of the antenna conductors may thus in each case be selected such that the coefficient of distance and width is approximately constant. Better approximations may be determined by more complex model calculations and, in for example, by using three-dimensional field simulations.

The use of ever lower capacitance capacitors as the distance increases may be used in addition or as an alternative thereto in order to adjust the impedances of the antenna conductors to one another. In this case, the antenna conductor may be considered a series connection of a parasitic inductance and the capacitor additionally connected into the antenna conductor. This corresponds to a series resonant circuit, which has a frequency-dependent impedance, where the impedance, starting from a conductive wire (e.g., an approximately infinite capacitance), initially falls as the capacitance falls, until a value falls below a capacitance threshold that corresponds to the case of resonance of the pure resonant circuit at the instantaneous frequency. If no excessively low capacitance capacitors are used, the use of a lower capacitance capacitor as the distance between the respective antenna conductor and the screening element increases thus leads to at least partial compensation of the change in impedance resulting from the change in distance. The capacitances used may be calculated with corresponding models and approximations of the transmitting antenna or, for example, determined in the context of solving an optimization problem that uses a three-dimensional field simulation.

The described approaches to compensation of an impedance (e.g., variation of the width of the antenna conductor or of a corresponding capacitor) may be used for just one pair of antenna conductors. In one embodiment, the stated interrelationships regarding the width of antenna conductors and/or their integrated capacitors apply, however, to any desired pairs of antenna conductors that have different radial distances from the screening element. In this way, inductance or impedance deviations between different antenna conductors due to a deviation in the distribution of the antenna conductors or in the shape of the screening element from cylindrical may be partly compensated.

The basic structure of the transmitting antenna may correspond to the known structure of cage antennas. Antenna conductors may be formed of microstrip antennas (e.g., in the form of conductor tracks) or of wires. Axially at the end, end rings, via which the various antenna conductors are coupled, may in each case be provided. The individual end ring segments, which may, for example, be connected conductively to the antenna conductors, may be coupled conductively to adjacent end conductor segments or via a capacitive coupling (e.g., via the screening element). The transmitting antenna may also be approximately cylindrical in shape, where it is possible to deviate from this, for example, by a slightly elliptical deformation or a flattened portion (e.g., a "D" shape). The terms axial (e.g., in the direction of the center line), radial, and circumferential are derived from this basic shape.

Previous discussions of the variation in the width of the antenna conductors have ignored the fact that such a variation may also lead to a change in resistance due to a change in line diameter. Since, however, transmitting antennas for magnetic resonance devices exhibit high transmission frequencies, this change in the real part of the impedance is typically negligible compared with the change in impedance resulting from this change in width (e.g., in the imaginary part of the impedance). For the purposes of more complex optimization of transmitting antennas (e.g., by using three-dimensional field simulations), this change in the real part of the impedance may, however, be taken into account, for example, to achieve a further improvement in field homogeneity.

The antenna conductors may be arranged along an ellipse situated perpendicularly on the center line or a circle flattened on one side, and/or a cross-section of the screening element situated perpendicularly to the center line may be elliptical or have the shape of a circle flattened on one side. As a result of an elliptical shape or such a flattened portion, the transmitting antenna may be less tall, since, for example, the height of a patient lying on a patient couch is much less than the lateral extent of such a patient couch. The shape of a flattened circle may, for example, be an enlargement of the radius of the circle in a portion of the circle or full flattening. The portion with the larger bending radius or the flattened portion may, for example, extend below a patient couch or another device for accommodating an object under investigation. Such a transmitting antenna shape is also known as a D shape.

For a predetermined transmission frequency, the impedance or the imaginary part of the impedance of all antenna conductors may be substantially identical. In this case, a substantially identical impedance may be an impedance that varies between the antenna conductors by, for example, at most 10%, at most 5%, 1%, or 0.5%. In other words, substantially the same antenna currents flow through the antenna conductors when the same voltage is applied. If the transmitting antenna is then supplied with two feed lines with a transmit signal of the same amplitude and with 90° phase shift, a substantially homogeneous circularly polarized B1 field may be emitted.

The antenna conductors may have end ring portions at corresponding ends. Adjacent end ring portions are coupled capacitively or conductively in the circumferential direction of the transmitting antenna. The extent of the end ring portions of the antenna conductors of the pair differ from one another in the axial direction and/or in the circumferential direction of the transmitting antenna. The dimensions of the end ring portions may, for example, be selected such that the capacitor formed of a respective end ring portion and a radially opposing portion of the screening element and/or the inductance resulting from interaction of these portions is substantially identical for all the end ring portions. This makes it possible to compensate not only the influence of the antenna conductors themselves on the resultant impedance but also the influence of the end ring portions, whereby the homogeneity of the B1 field produced may be improved further.

In addition to the transmitting antenna according to the present embodiments, the present embodiments relate to a magnetic resonance device including a transmitting antenna and a signal generator configured to provide at least one high-frequency signal to the transmitting antenna. The transmitting antenna is a transmitting antenna according to the present embodiments. The signal generator or a signal splitter connected between the signal generator and the transmitting antenna may provide two high-frequency signals that are guided to separate terminals of the transmitting antenna. The high-frequency signals have a phase shift of 90° and/or the same amplitudes. It is thus possible in the case of the transmitting antenna according to the present embodiments, in which the distance between the antenna conductors and the screening element varies, for a simple drive method to be used, as is also used for transmitting antennas in which the distance between antenna conductors and screening element is identical for all antenna conductors. By adapting the widths of the antenna conductors or varying the capacitances of the antenna conductors, non-homogeneity of the circularly polarized B1 field resulting may be prevented or such a non-homogeneity may be at least largely reduced.

The antenna conductors may be arranged along an ellipse situated perpendicularly on the longitudinal axis or a circle flattened on one side, or a cross-section of the screening element situated perpendicularly to the center line may be elliptical or have the shape of a circle flattened on one side. In both cases, the main axis of the ellipse extends parallel to a bearing surface for an object under investigation (e.g., to a patient couch) or the respective flattened portion of the circle extends below the bearing surface. As a result of the described procedure, the structural height of the transmitting antenna and thus, for example, in the case where the transmitting antenna is used as a whole-body antenna, in which the object under investigation is accommodated, the total structural height of the magnetic resonance device may be reduced.

The present embodiments also relate to a method for producing a transmitting antenna for a magnetic resonance device, where the transmitting antenna includes a plurality of antenna conductors arranged spaced circumferentially from one another about a longitudinal axis and extending parallel to the longitudinal axis, and a screening element extending parallel to the longitudinal axis thereof and encompassing the antenna conductors. At least one pair of the antenna conductors is arranged such that the radial distance between a first antenna conductor of the pair and the screening element is smaller than the radial distance between a second antenna conductor of the pair and the screening element, a width of the first antenna conductor is selected to be smaller in the circumferential direction than the width of the second antenna conductor in the circumferential direction, and/or the axial ends of the first antenna conductor are coupled together via a higher capacitance capacitor than the axial ends of the second antenna conductor.

The method according to the present embodiments may be further developed with the features explained in relation to the transmitting antenna or the magnetic resonance device with the advantages mentioned herein and vice versa.

The widths of the antenna conductors and/or the capacitor coupling the ends of the respective antenna conductor may be determined by solving an optimization problem for optimizing the field homogeneity of a circularly polarized B1 field in the case of a given excitation of the transmitting antenna. Optimization may be performed iteratively, where a predetermined number of optimization acts may be carried out, or the optimization acts are repeated until the method converges (e.g., a predetermined maximum deviation from an ideal homogeneity is observed). In the course of optimization, a three-dimensional field simulation may, for example, be used.

BRIEF DESCRIPTION OF THE DRAWINGS

FIG. 2 shows a detail depiction of an embodiment of transmitting antennas;

FIG. 3 shows a detail depiction of an embodiment of transmitting antennas; and

DETAILED DESCRIPTION

Figure 1:
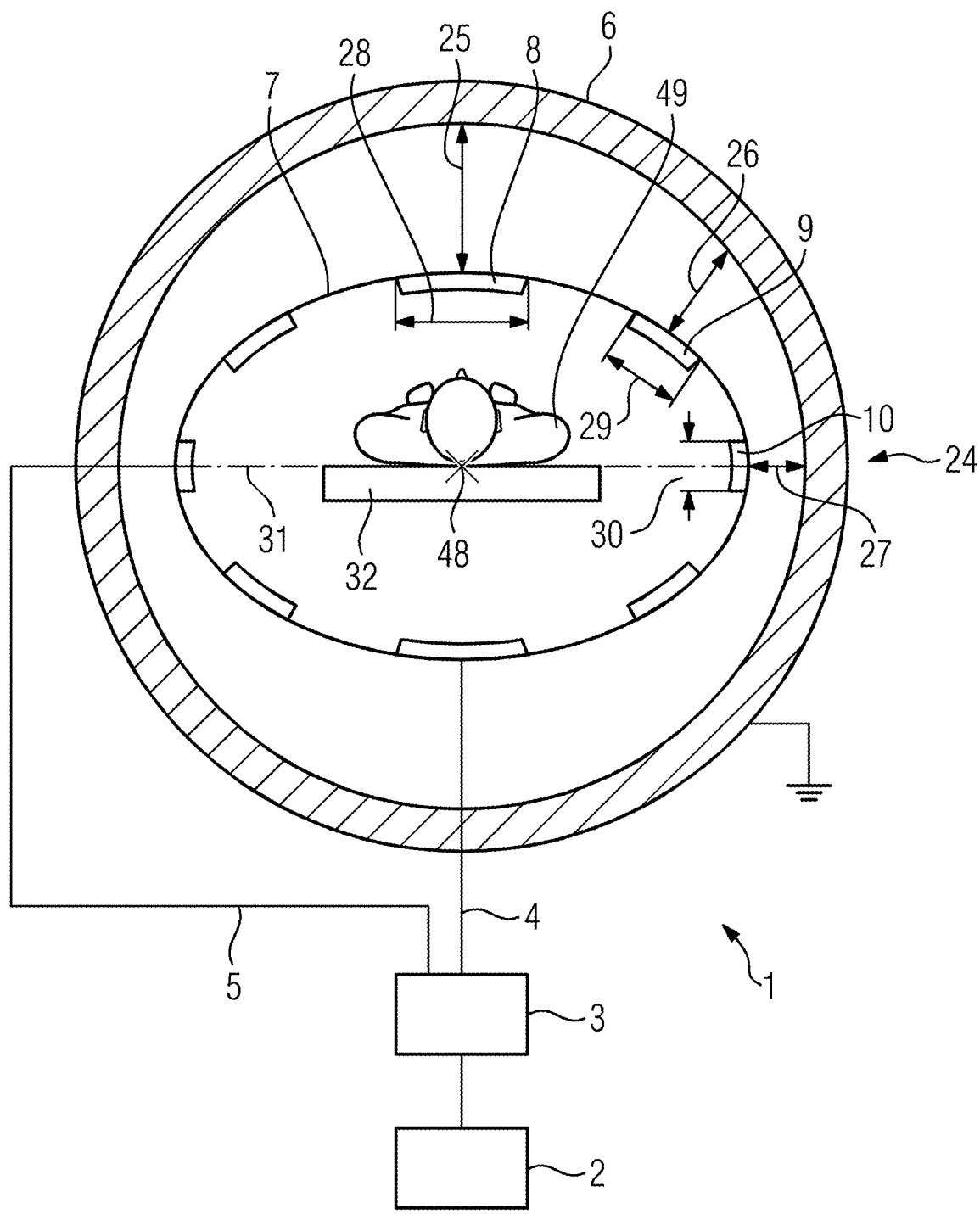
FIG. 1 shows an exemplary embodiment of a magnetic resonance device that includes an exemplary embodiment of a transmitting antenna.

FIG. 1 shows an exemplary embodiment of a magnetic resonance device 1, of which only the components that are relevant to the present embodiments are shown for reasons of clarity. A signal generator 2 generates a high-frequency signal 4, 5 that is supplied via a signal splitter 3 to the transmitting antenna 24 in order to irradiate a circularly polarized B1 field into an investigation volume. As a result, the tissue of the object under investigation 49 may be excited in order to perform magnetic resonance tomography. For reasons of clarity, FIG. 1 shows neither apparatuses for providing the main magnetic field or the gradient magnetic field, nor receiving antennas, processing devices, or other components of the magnetic resonance device 1 that do not directly serve in providing the B1 field.

Signal splitter 3 guides high-frequency signals 4, 5 of identical amplitude but phase-shifted by 90° to two terminals of the transmitting antenna 24. Were transmitting antenna 24 cylindrically symmetrical and were identical antenna conductors distributed along a cylindrical surface, a homogeneous, circularly polarized B1 field would be emitted therefrom.

In the exemplary embodiment shown, however, antenna conductors 8 to 10 are fastened to an elliptical support element 7 (e.g., to a plastics carrier), while the screening element 6 is substantially cylindrical. Such an arrangement may be advantageous, since the bearing surface 32 (e.g., a patient couch and the object under investigation 49 borne thereon (a patient) requires significantly more space in the transverse direction of the image than in the vertical direction. In one embodiment, in order to reduce the space required by the magnetic resonance device 1 and to reduce the associated costs, the antenna conductors 8 that extend perpendicular to the image plane and parallel to the center line 48 of the transmitting antenna 24 may be arranged along an elliptical shape while the screening element is circular, or vice versa. The main axis 31 of the ellipse may be parallel to the bearing surface 32.

With such an arrangement, the radial distance 25 to 27 between antenna conductors 8 to 10 and the screening element 6 varies. Screening element 6 is a conductor that is at a defined potential (e.g., frame potential). Due to the different distances 25 to 27 between antenna conductors 8 to 10 and the screening element 6, a similar configuration of antenna conductors 8 to 10 would result in the lowest inductance and thus the lowest impedance for antenna conductor 10. For antenna conductor 8, the configuration would result in the greatest inductance and thus the greatest impedance. Thus, significantly larger currents would be conducted by antenna conductor 10 than by antenna conductor 8, which may result in a non-homogeneous B1 field, high component loads, and locally high specific absorption by the object under investigation 49. To counteract this, a smaller width 30 is selected for the antenna conductor 10 situated relatively close to the screening element 6 than the width 28 of antenna conductor 8 spaced relatively far away from the screening element 6. A medium width 29 is selected for antenna conductor 9 at a medium distance 26.

To clarify this principle further, FIG. 2 shows a developed detail view of a further transmitting antenna 37 showing solely antenna conductors 11 to 14 of the transmitting antenna and ring portions 33 to 36 coupling antenna conductors 11 to 14. Transmitting antenna 37 includes sixteen antenna conductors 11 to 14, of which only the eight antenna conductors 11 to 14 arranged in the upper half of the transmitting antenna 37 are depicted. The antenna conductors 11 shown in the middle of the image are spaced particularly far from the screen (not shown) and are thus particularly wide in configuration. Towards the side, the distance between antenna conductors 12, 13 and 14 and the screening element (not shown) becomes increasingly smaller, and therefore, the width of antenna conductors 12, 13, 14 progressively decreases. It may thus be provided that antenna conductors 11 to 14 have substantially the same inductance, and therefore, they may also have substantially the same impedance. The result of this is uniform current distribution and thus also a homogeneous B1 field.

Coupling of the individual antenna conductors 11 to 14 proceeds, as is known for corresponding prior art transmitting antennas, via end ring segments 33 to 36, which are associated with the individual antenna conductors 11 to 14. The feed lines shown in FIG. 1 for the high-frequency signals 4, 5 may, for example, be connected to two of the end ring portions 33 to 36. Each different end ring portion 33 to 36 is coupled capacitively to the directly adjacent end ring portion 33 to 36. This may be achieved using interposed capacitors, but coupling may be achieved in that the two adjacent end ring portions 33 to 36 are coupled capacitively via the screen (not shown). It would alternatively also be possible to connect end ring portions 33 to 36 conductively.

In addition to the inductance of antenna conductors 11 to 14, the configuration of end ring portions 33 to 36 also influences current flow through the individual antenna conductors 11 to 14. As shown in FIG. 2, it may therefore be advantageous to adapt the extent of the end ring portions in the axial and/or circumferential direction of transmitting antenna 37 as a function of the distance of the respective antenna conductors 11 to 14 and corresponding end ring portions 33 to 36 from the screening element (not shown).

In some cases, the variation in the width of antenna conductors 8 to 14 discussed with reference to FIGS. 1 and 2 may be undesirable or be insufficient to achieve uniform current flow through antenna conductors 8 to 14. In addition or as an alternative to width adaptation, an additional capacitor may, as shown diagrammatically in FIG. 3, be used in antenna conductors 15 to 17 in order to adapt the total impedance of the various antenna conductors 15 to 18 to one another. The depiction and fundamental structure of transmitting antenna 41 shown in FIG. 3 corresponds to the depiction and structure of transmitting antenna 37 shown in FIG. 2. Thus in FIG. 3 too, the distance is at a maximum between the screening element (not shown) and the centrally depicted antenna conductors 15, while the distance decreases progressively for antenna conductors 16, 17, 18 and reaches a minimum for antenna conductor 18.

In the exemplary embodiment shown, no capacitor connected between the axial ends 42, 43 of the antenna conductor 18 is used for the antenna conductor 18 situated closest to the screen. The impedance of the antenna conductor 18 is thus dependent substantially solely on a corresponding inductance. As explained above, in an identical configuration of antenna conductors 15 to 17, the inductance would increase progressively as the distance from the screen increases. To compensate this increase in inductance and to achieve a substantially identical impedance for antenna conductors 15 to 18, capacitors 38 to 40 are used in antenna conductors 15 to 17. Capacitor 38 is the lowest capacitance capacitor, and capacitor 40 is the highest capacitance capacitor. In principle, an additional capacitor, which is of even higher capacitance than capacitor 40, may likewise be used in antenna conductor 18. Use of such a capacitor is not necessary, however, since a straight conductor has an approximately infinite capacitance.

Provision of capacitors 38 to 40 causes antenna conductors 15 to 17 to act as a series resonant circuit. This provides that, at a given frequency with decreasing capacitance, the amount of impedance of the antenna conductors initially falls until the amount of impedance rises again once the resonance condition has been reached. If the antenna conductors operate below resonance, the lowest capacitance capacitor 38 in antenna conductor 15 leads to the greatest reduction in impedance. This makes it possible to select capacitors 38 to 40 such that the inductance of antenna conductors 15 to 17, which increases as the distance from the screen increases, is precisely or at least approximately compensated by the provision of this additional capacitor.

Figure 4:
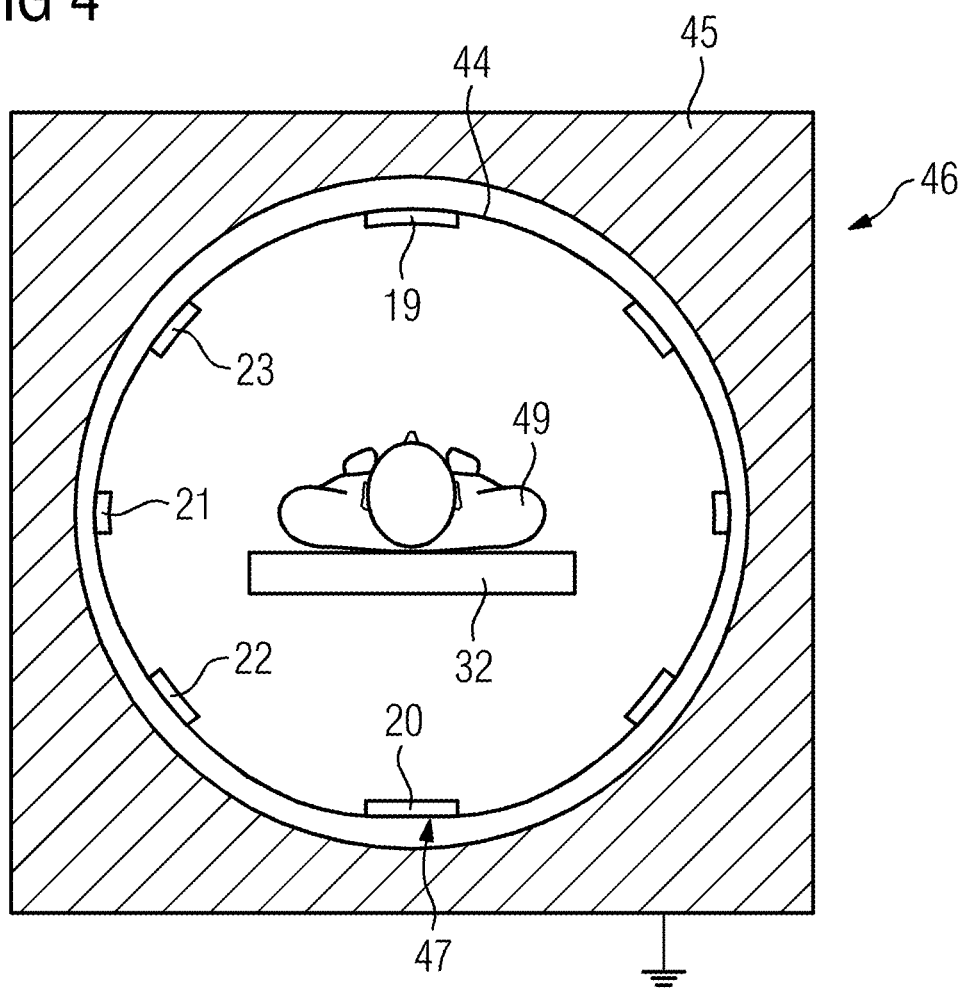
FIG. 4 shows a further exemplary embodiment of a transmitting antenna.

FIG. 4 shows a further exemplary embodiment of a transmitting antenna 46, where this differs from the transmitting antenna 24 shown in FIG. 1 in that a support element 44, which supports the antenna conductors 19 to 22, is not elliptical but rather takes the shape of a flattened circle or a D shape. Because a flattened portion 47 of the circular support element 44 with a larger radius of curvature passes underneath the bearing surface 32, the support element 44 may achieve a smaller structural height overall while offering the same amount of space for an object under investigation 49.

If, moreover, a screening element 45 of circular cross-section is used, the radial distance between antenna conductors 19 to 23 and the screening element 45 again varies. Antenna conductors 19 and 20 exhibit the maximum distance from the screening element 45. To compensate this, the antenna conductors 19 and 20 also have the largest width. Alternatively or in addition, as explained above, a relatively low capacitance capacitor may be connected between the ends of antenna conductors 19 and 20. Antenna conductors 21 and 22 are arranged close to the wall of the screening element 45 and are thus of relatively narrow configuration or have a relatively high capacitance capacitor or no capacitor. Antenna conductor 23 exhibits a medium distance and thus also has a medium width or medium capacitance capacitor.

The above-explained approaches may thus also be used in the event of antenna conductors 19 to 23 being arranged in a flattened circular shape or a D shape in order to achieve uniform current distribution between antenna conductors 19 to 23 and thus also high field homogeneity. Simulations have shown that in a similar configuration to the configuration shown in FIG. 4, in the case of an identical bar width, the currents across the various bars vary by more than 50%, while the variation in the case of an optimized bar width may be reduced to roughly 10%. As a result of the procedure described, a considerable improvement in field homogeneity and a reduction in the loading of objects under investigation or of components of the transmitting antenna may thus be achieved.

The examples shown assume a deviation of the arrangement of antenna conductors 8 to 23 from a circular shape while retaining a circular shape for the screening element. Additionally or alternatively, the screening element may deviate from the circular shape. In this case too, the result is different distances from the screening element for different antenna conductors. A resultant non-homogeneity of power distribution or of the B1 field may be compensated, as explained above.

Although the invention has been illustrated and described in greater detail with reference to the exemplary embodiments, the invention is not restricted by the disclosed examples. Other variations may be derived therefrom by a person skilled in the art without going beyond the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A transmitting antenna for a magnetic resonance device comprising:

a plurality of antenna conductors arranged spaced from one another circumferentially around a center line and extending parallel to the center line, wherein the plurality of antenna conductors have end ring portions at respective ends, wherein adjacent end ring portions in the circumferential direction of the transmitting antenna are coupled capacitively or conductively, and wherein an extent of the end ring portions of the antenna conductors of the at least one pair differ from one another in an axial direction of the transmitting antenna; and a screening element extending parallel to the center line and circumferentially encompassing the plurality of antenna conductors, wherein for at least one pair of antenna conductors of the plurality of antenna conductors, a radial distance between a first antenna conductor of the at least one pair of antenna conductors and the screening element is smaller than a radial distance between a second antenna conductor of the at least one pair of antenna conductors and the screening element, and wherein a width of the first antenna conductor is smaller in a circumferential direction than a width of the second antenna conductor in the circumferential direction, axial ends of the first antenna conductor are coupled together via a higher capacitance capacitor than axial ends of the second antenna conductor, or any combination thereof.

2. The transmitting antenna of claim 1, wherein the plurality of antenna conductors are arranged along an ellipse situated perpendicularly to the center line, wherein a cross-section of the screening element situated perpendicularly to the center line is elliptical or has a shape of a circle flattened on one side, or a combination thereof.

3. The transmitting antenna of claim 2, wherein for a predetermined transmission frequency, an impedance or an imaginary part of the impedance of all antenna conductors of the plurality of antenna conductors is substantially identical.

4. The transmitting antenna of claim 1, wherein for a predetermined transmission frequency, an impedance or an imaginary part of the impedance of all antenna conductors of the plurality of antenna conductors is substantially identical.

5. A magnetic resonance device comprising:

a transmitting antenna comprising:

a plurality of antenna conductors arranged spaced from one another circumferentially around a center line and extending parallel to the center line, wherein the plurality of antenna conductors have end ring portions at respective ends, wherein adjacent end ring portions in the circumferential direction of the transmitting antenna are coupled capacitively or conductively, and wherein an extent of the end ring portions of the antenna conductors of the at least one pair differ from one another in an axial direction of the transmitting antenna; and a screening element extending parallel to the center line and circumferentially encompassing the plurality of antenna conductors, wherein for at least one pair of antenna conductors of the plurality of antenna conductors, a radial distance between a first antenna conductor of the at least one pair of antenna conductors and the screening element is smaller than a radial distance between a second antenna conductor of the at least one pair of antenna conductors and the screening element; and a signal generator configured to provide at least one high-frequency signal to the transmitting antenna, wherein a width of the first antenna conductor is smaller in a circumferential direction than a width of the second antenna conductor in the circumferential direction, axial ends of the first antenna conductor are coupled together via a higher capacitance capacitor than axial ends of the second antenna conductor, or any combination thereof.

6. The magnetic resonance device of claim 5, wherein the signal generator or a signal splitter connected between the signal generator and the transmitting antenna is configured to provide two high-frequency signals that are guided to separate terminals of the transmitting antenna, and wherein the two high-frequency signals have a phase shift of 90°, same amplitudes, or a combination thereof.

7. The magnetic resonance device of claim 6, wherein the plurality of antenna conductors are arranged along an ellipse situated perpendicularly to the center line or are arranged along a circle flattened on one side situated perpendicularly to the center line, or a cross-section of the screening element situated perpendicularly to the center line is elliptical or has a shape of a circle flattened on one side, and wherein a main axis of the ellipse extends parallel to a bearing surface for an object under investigation, or the respective flattened portion of the circle extends underneath the bearing surface.

8. The magnetic resonance device of claim 5, wherein the plurality of antenna conductors are arranged along an ellipse situated perpendicularly to the center line or are arranged along a circle flattened on one side situated perpendicularly to the center line, or a cross-section of the screening element situated perpendicularly to the center line is elliptical or has a shape of a circle flattened on one side, and wherein a main axis of the ellipse extends parallel to a bearing surface for an object under investigation, or the respective flattened portion of the circle extends underneath the bearing surface.

9. The magnetic resonance device of claim 8, wherein the plurality of antenna conductors are arranged along an ellipse situated perpendicularly to the center line, and wherein the main axis of the ellipse extends parallel to a patient couch.

10. A method for producing a transmitting antenna for a magnetic resonance device, the method comprising:

arranging a plurality of antenna conductors arranged spaced from one another circumferentially around a center line and extending parallel to the center line, wherein the plurality of antenna conductors have end ring portions at respective ends, wherein adjacent end ring portions in the circumferential direction of the transmitting antenna are coupled capacitively or conductively, and wherein an extent of the end ring portions of the antenna conductors of the at least one pair differ from one another in an axial direction of the transmitting antenna; and arranging a screening element extending parallel to the center line and circumferentially encompassing the plurality of antenna conductors;

arranging at least one pair of the antenna conductors of the plurality of antenna conductors such that a radial distance between a first antenna conductor of the at least one pair of the antenna conductors and the screening element is smaller than a radial distance between a second antenna conductor of the at least one pair of the antenna conductors and the screening element; and selecting a width of the first antenna conductor to be smaller in the circumferential direction than a width the second antenna conductor in the circumferential direction, coupling axial ends of the first antenna conductor together via a higher capacitance capacitor than axial ends of the second antenna conductor, or any combination thereof.

11. The method of claim 10, further comprising determining widths of the plurality of antenna conductors, respectively, the capacitor coupling the ends of the respective antenna conductor, or the plurality of antenna conductors, respectively, and the capacitor coupling the ends of the respective antenna conductor, the determining comprising solving an optimization problem for optimizing a field homogeneity of a circularly polarized B1 field in the case of a given excitation of the transmitting antenna.

12. The method of claim 11, wherein a three-dimensional field is used for the purposes of optimization.

* * * * *